United States Patent [19]

Davidson et al.

[11] Patent Number: 4,644,265
[45] Date of Patent: Feb. 17, 1987

[54] NOISE REDUCTION DURING TESTING OF INTEGRATED CIRCUIT CHIPS

[75] Inventors: Evan E. Davidson, Hopewell Junction; David A. Kiesling, Poughkeepsie, both of N.Y.

[73] Assignee: International Business Machines Corporation, Armonk, N.Y.

[21] Appl. No.: 771,928

[22] Filed: Sep. 3, 1985

[51] Int. Cl.[4] ................... G01R 15/12; G01R 31/28
[52] U.S. Cl. .............................. 324/73 R; 324/158 R
[58] Field of Search ..................... 324/73 R, 158 R; 307/549

[56] References Cited

U.S. PATENT DOCUMENTS

| | | | |
|---|---|---|---|
| 3,599,161 | 8/1971 | Stoughton | 340/172.5 |
| 3,694,632 | 9/1972 | Bloomer | 235/150.53 |
| 3,784,910 | 1/1974 | Sylvan | 324/73 |
| 3,848,188 | 11/1974 | Ardezzone | 324/73 |
| 3,873,818 | 3/1975 | Barnard | 235/153 |
| 3,924,144 | 12/1975 | Hadamard | 307/303 |
| 3,961,251 | 6/1976 | Hurley | 324/73 |
| 3,976,940 | 8/1976 | Chau | 324/73 |
| 4,066,882 | 1/1978 | Esposito | 235/302 |
| 4,070,565 | 1/1978 | Borrell | 235/302 |
| 4,125,763 | 11/1978 | Drabling | 235/302 |
| 4,180,203 | 12/1979 | Masters | 235/302 |
| 4,216,539 | 8/1980 | Raymond | 371/20 |
| 4,298,980 | 11/1981 | Hadju | 371/25 |
| 4,334,310 | 6/1982 | Maley | 371/64 |
| 4,348,759 | 9/1982 | Schnurmann | 371/20 |
| 4,398,106 | 8/1983 | Davidson | 307/549 |
| 4,441,075 | 4/1984 | McMahon | 324/73 |
| 4,494,066 | 1/1985 | Goel | 324/73 |
| 4,504,784 | 3/1985 | Goel | 324/73 |
| 4,551,838 | 11/1985 | Gannett | 324/73 R |

OTHER PUBLICATIONS

"Logic Structure for Testing Tri-State Drivers" by S. Das Gupta and C. E. Radke, *IBM Technical Disclosure Bulletin*, vol. 21, No. 7, Dec. 1978, pp. 2796-2797.
"Driver Power Distribution" by A. E. Barish and R. L. Ehrlickman, *IBM Technical Disclosure Bulletin*, vol. 22, No. 11, Apr. 1980, pp. 4935-4937.
"Functionally Independent AC Test for Multi-Chip Packages" by P. Goel and M. T. McMahon, *IBM Technical Disclosure Bulletin*, vol. 25, No. 5, pp. 2308-2310.
"Chip Partitioning Aid" by M. C. Graf and R. A. Rasmussen, *IBM Technical Disclosure Bulletin*, vol. 25, No. 5, Oct. 1982, pp. 2314-2315.
"Driver-Sequencing Circuit" by D. C. Banker, F. A. Montegari and J. P. Norsworthy, *IBM Technical Disclosure Bulletin*, vol. 26, No. 7B, Dec. 1983, pp. 3621-3622.

*Primary Examiner*—Ernest F. Karlsen
*Assistant Examiner*—Vinh P. Nguyen
*Attorney, Agent, or Firm*—Wesley DeBruin

[57] ABSTRACT

Disclosed is a test system having circuitry for reducing off-chip driver switching (delta I) noise. The test system employs a tester connected to and electrically testing an integrated circuit chip. The integrated circuit chip has a plurality of input terminals for receiving an electrical test pattern from the tester. The integrated circuit chip also includes a plurality of output driver circuits having outputs connected to the tester. The test system is characterized in that the integrated circuit chip includes a driver sequencing network under control of the tester for sequentially conditioning the off-chip driver circuits for possible switching.

7 Claims, 11 Drawing Figures

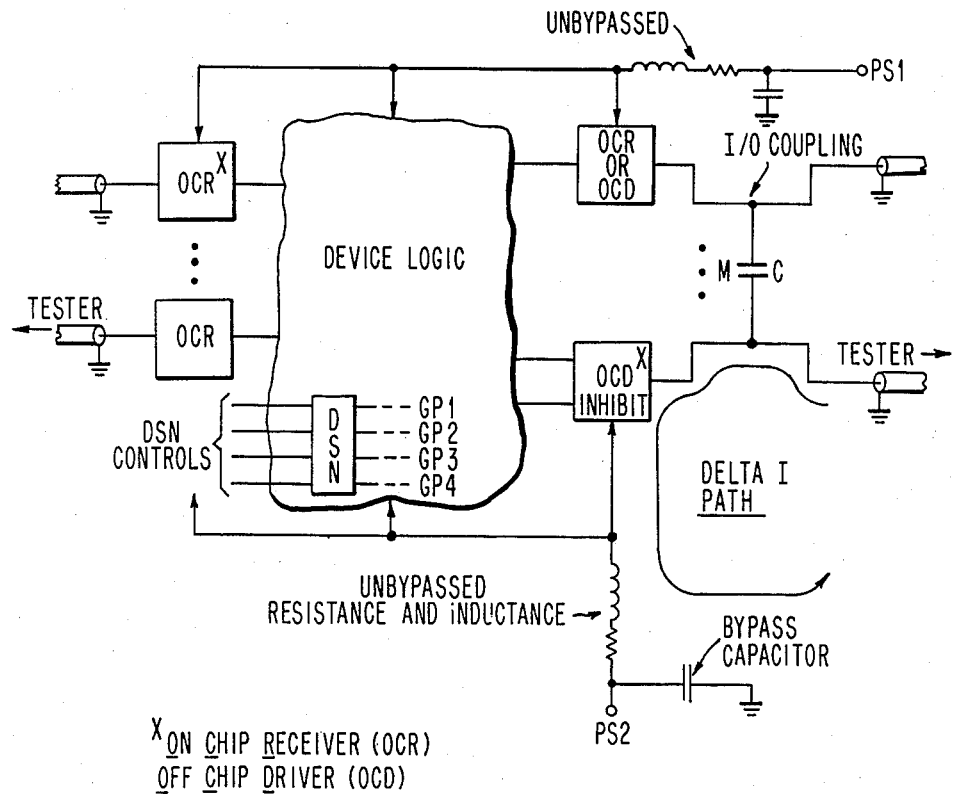
FIG. 1
X ON CHIP RECEIVER (OCR)
OFF CHIP DRIVER (OCD)
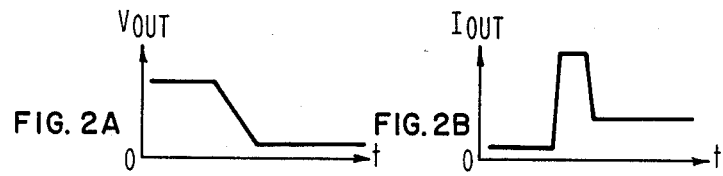
FIG. 2A  FIG. 2B
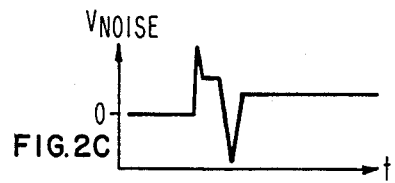
FIG. 2C
POWER SUPPLY NOISE
FIG. 2

EXAMPLE OF A DRIVER SEQUENCING NETWORK

NOISE REDUCTION DURING TESTING OF INTEGRATED CIRCUIT CHIPS

BACKGROUND OF THE INVENTION

1. Related U.S. Patent Application

U.S. patent application Ser. No. 540,072 Oct. 7, 1983, now U.S. Pat. No. 4,553,043, entitled "Oscillation Prevention During Testing of Integrated Circuit Logic Chips" by C. W. Cha, granted Nov. 12, 1985 as U.S. Pat. No. 4,553,049.

2. Technical Field

This invention relates to testing of integrated circuit logic chips and more particularly to excessive noise (Delta I) prevention during the testing thereof.

During application of functional test patterns on VLSI devices electrical noise is generated on either the power supply or I/O lines such that the internal logic state of the device becomes unpredictable and the test measurement fails. Electrical noise of significant magnitude is generated in two fashions by the switching of off chip drivers as more fully described below.

When many off chip drivers switch simultaneously a large change in power supply current results (delta I). This delta I current path flows from the driver output wire, through the driver, through the unbypassed inductance and resistance of the power supply distribution network, through the bypass capacitor and back to the tester ground. The voltage that is generated across the unbypassed inductance and resistance is expressed as follows, $V = LdI/dt + RdI$, where V is the generated voltage, L is the unbypassed inductance, R is resistance, dI is delta I and dI/dt is the rate of change of the current I with respect to time. DI and dI/dt relate directly to the driver type and the number of drivers concurrently switching, as does the noise magnitude.

Voltage and Current signals which change as a driver changes state also couple through mutual inductance and mutual capacitance into nearby I/O paths. Mutual inductance and mutual capacitance coupling may contribute, or solely, result in false switching and test failures. The voltage and current due to coupling is expressed by the equations $V = MdI/dt$ and $I = CdV/dt$, where M is the mutual inductance, C is the mutual capacitance between the paths, and dV/dt is the rate of change of voltage with respect to time. Again the noise magnitude relates directly to the driver type (speed) and the number of drivers coupling noise into a nearby I/O path.

Alternative Solutions:

(A) Modify the tester. This has been done. However sophisticated electrical noise still appears. The product design cycle is fast outstripping the testers ability to compensate.

(B) Pre-Charge Output Lines. This technique allows as many drivers to switch as the pattern dictates, but does not allow them to switch until the tester precharges all of the output lines to their expected state before switching occurs. Once switched, each output termination by the tester must be returned to its proper value before the outputs can be measured. This method is useful, but has three main drawbacks:

(1) Test time increases considerably; (2) The performance and real estate overhead is high for the chip designer; (3) The expected output states must be known at the time of execution of each pattern. This is inconsistent with the self test philosophy which logs output states for each pattern and compares them to expected states long after pattern execution is complete.

(C) Test pattern control of the number of outputs switching—This assumes the part number will allow itself to be limited to a specific number of drivers switching and still be able to achieve greater than 99.5% test coverage. The greater problem however, is that the simulator must apply patterns in the exact fashion the tester employs them. Most test machines apply all input changes serially which would cause excessive simulation time for software control of driver switching.

(D) The employment of an on-chip (or device contained) Driver Sequencing Network in accordance with applicants' invention is fully disclosed hereinafter.

Reference is made to U.S. Pat. No. 4,441,075 entitled "Electric Chip-In Place Test (ECIPT) Structure and Method" granted Apr. 3, 1984 to P. Goel et al. The specification and drawings of U.S. Pat. No. 4,441,075 is incorporated herein by reference to the full and same extent as though it was incorporated herein word for word.

3. Prior Art

A number of test techniques, testers and test circuitry for testing integrated circuit devices are known to the art. It is to be appreciated with reference to the subject invention, that the following art is not submitted to be the only prior art, the best prior art, or the most pertinent prior art.

BACKGROUND ART

U.S. Patents

U.S. Pat. No. 3,599,161 entitled "Computer Controlled Test System And Method" granted Aug. 10, 1971 to A. M. Stoughton et al.

U.S. Pat. No. 3,694,632 entitled "Automatic Test Equipment Utilizing A Matrix of Digital Differential Analyzer Integrators To Generate Interrogation Signals" granted Sept. 26, 1972 to D. J. Bloomer.

U.S. Pat. No. 3,784,910 entitled "Sequential Addressing Network Testing System" granted Jan. 8, 1974 to T. P. Sylvan.

U.S. Pat. No. 3,848,188 entitled "Multilayer Control System For A Multi-Array Test Probe Assembly" granted Nov. 12, 1974 to F.J. Ardezzone et al.

U.S. Pat. No. 3,873,818 entitled "Electronic Tester For Testing Devices Having A High Circuit Density" granted Mar. 25, 1975 to J. D. Barnard.

U.S. Pat. No. 3,924,144 entitled "Method For Testing Logic Chips and Logic Chips Adapted Therefor" granted Dec. 2, 1975 to G. Hadamard.

U.S. Pat. No. 3,961,251 entitled "Testing Embedded Arrays" granted June 1, 1976 to W. J. Hurley et al.

U.S. Pat. No. 3,976,940 entitled "Testing Circuit" granted Aug. 24, 1976 to Y. B. Chau.

U.S. Pat. No. 4,066,882 entitled "Digital Stimulus Generating And Response Measuring Means" granted Jan. 3, 1978 to C. M. Esposito.

U.S. Pat. No. 4,070,565 entitled "Programmable Tester Method And Apparatus" granted Jan. 24, 1978 to R. N. Borrell.

U.S. Pat. No. 4,125,763 entitled "Automatic Tester For Microprocessor Board" granted Nov. 14, 1978 to R. B. Drabing et al.

U.S. Pat. No. 4,180,203 entitled "Programmable Test Point Selector Circuit" granted Dec. 25, 1979 to H. M. Masters.

U.S. Pat. No. 4,216,539 entitled "In-Circuit Digital Tester" granted Aug. 5, 1980 to D. W. Raymond et al.

U.S. Pat. No. 4,298,980 entitled "LSI Circuitry Comforming to Sensitive Scan Design (LSSD) Rules and Method of Testing Same" granted Nov. 3, 1981 to J. Hajder et al.

U.S. Pat. No. 4,334,310 entitled "Noise Suppressing BiLevel Data Signal Driver Circuit Arrangement" granted June 8, 1982 to G. A. Maley.

U.S. Pat. No. 4,348,759 entitled "Automatic Testing Of Complex Semiconductor Components With Test Equipment Having Less Channels Than Those Required by The Component Under Test" granted Sept. 7, 1982 to H. D. Schnurmann.

U.S. Pat. No. 4,398,106 entitled "On-Chip Delta-I Noise Clamping Circuit" granted Aug. 9, 1983 to E. E. Davidson et al.

U.S. Pat. No. 4,441,075 entitled "Electrical Chip-In-Place Test (ECIPT) Structure & Method" granted Apr. 3, 1984 to P. Goel et al.

U.S. Pat. No. 4,494,066 entitled "Method of Electrically Testing a Packaging Structure Having N Interconnected Integrated Circuit Chips" granted Jan. 15, 1985 to P. Goel et al.

U.S. Pat. No. 4,504,784 entitled "Method Of Electrically Testing A Packaging Structure Having N Interconnected Integrated Circuit Chips" granted Mar. 12, 1985 to P. Goel et al.

IBM Technical Disclosure Bulletin Publications

"Logic Structure For Testing Tri-State Drivers" by S. DasGupta and C. E. Radke, Vol. 21, No. 7, Dec. 1978, pages 2796-7.

"Driver Power Distribution" by A. E. Barish and R. Ehrlickman, Vol. 22, No. 11, Apr. 1980, pages 4935-7.

"Functionally Independent A.C. Test For Multi-Chip Package" by P. Goel and M. T. McMahon, Vol. 25, No. 5, October 1982, pages 2308-10.

"Chip Partitioning Aid" by M. C. Graf and R. A. Rasmussen, Vol. 25, No. 5, October 1982, pages 2314-5.

"Driver Sequencing Circuit" by D. C. Banker, F. A. Montegari and J. P. Norsworthy, Vol. 26, No. 7B, December 1983, pages 3621-2.

SUMMARY OF THE INVENTION

The Invention may be summarized as a driver sequencing network on the device, or chip, to be tested which gives the tester (machine) control of the timing between the switching of groups of driver circuits so that more than a predetermined number of driver circuits concurrently switching state is precluded. The driver sequencing network is such that no one group of driver output pins can create enough delta I or coupled noise to cause a test failure. The driver sequencing network may be disabled to give full control of the driver outputs to the device being tested. In a normal application, i.e. intended purpose, or function of the device, the driver sequencing network is disabled. The function of the driver sequencing network is to control off chip driver switching during test.

These and other features and advantages of the invention will be apparent from the following more particular description of the preferred embodiment of the invention as illustrated in the accompanying drawings.

(1) A primary object of the invention is to improve the efficiency and reliability of the testing of integrated circuit devices and/or chips.

(2A primary object of the invention is to provide a driver sequencing network on an integrated circuit device, or chip, which permits a test machine to control the switching time of driver circuits (or groups of driver circuits) of the integrated circuit device, or chip, under test.

(3) A primary object of the invention is to improve the efficiency and reliability of the testing integrated circuit logic chips by significantly if not totally obviating the "delta I" problem due to simultaneous switching of drivers during test.

(4) An object of the invention is to provide a driver sequencing network on a logic chip, or the like, to sequence, under tester control, the switching of drivers, or groups of drivers, during test.

BRIEF DESCRIPTION OF THE DRAWING FIG. 1 illustrates, in accordance with the prior art, the delta I current path from the driver output wire, through the driver, through the unbypassed inductance and resistance of the power supply distribution network, through the by pass capacitor and back to the tester ground.

FIG. 2 is comprised of FIGS. 2A, 2B and 2C.

FIG. 2A depicts the voltage waveform imposed on the driver output wire by the off chip driver during switching.

FIG. 2B depicts the delta I waveform which occurs on the delta I path shown in the circuitry of FIG. 1.

FIG. 2C depicts the voltage generated across the unbypassed inductance and resistance of the prior art circuitry of FIG. 1.

FIG. 3A depicts the coupled voltage V=MdI/dt of the prior art circuitry of FIG. 1.

FIG. 3B depicts the coupled current I=Cdv/dt of the prior art circuit of FIG. 1.

FIG. 3C depicts the combined voltage noise waveform at the output of the prior art circuitry of FIG. 1.

Figure 4:
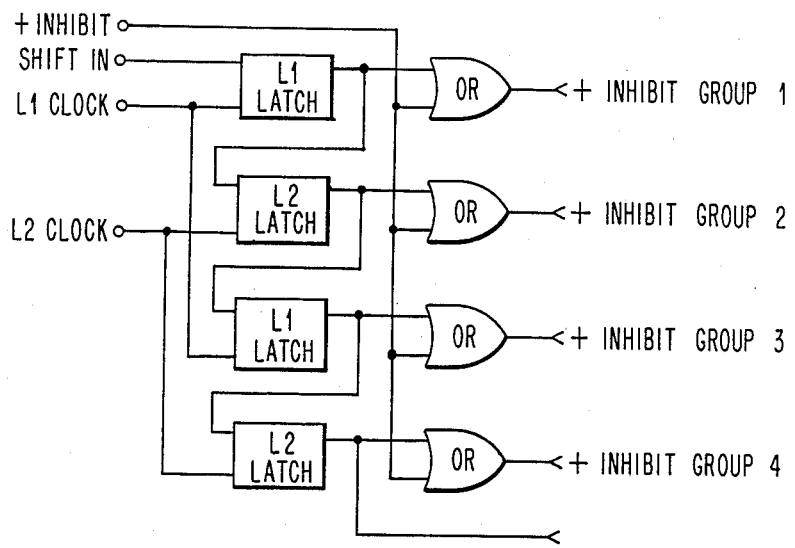

FIG. 4 discloses a representative driver sequencing network in accordance with the invention.

Figure 5:
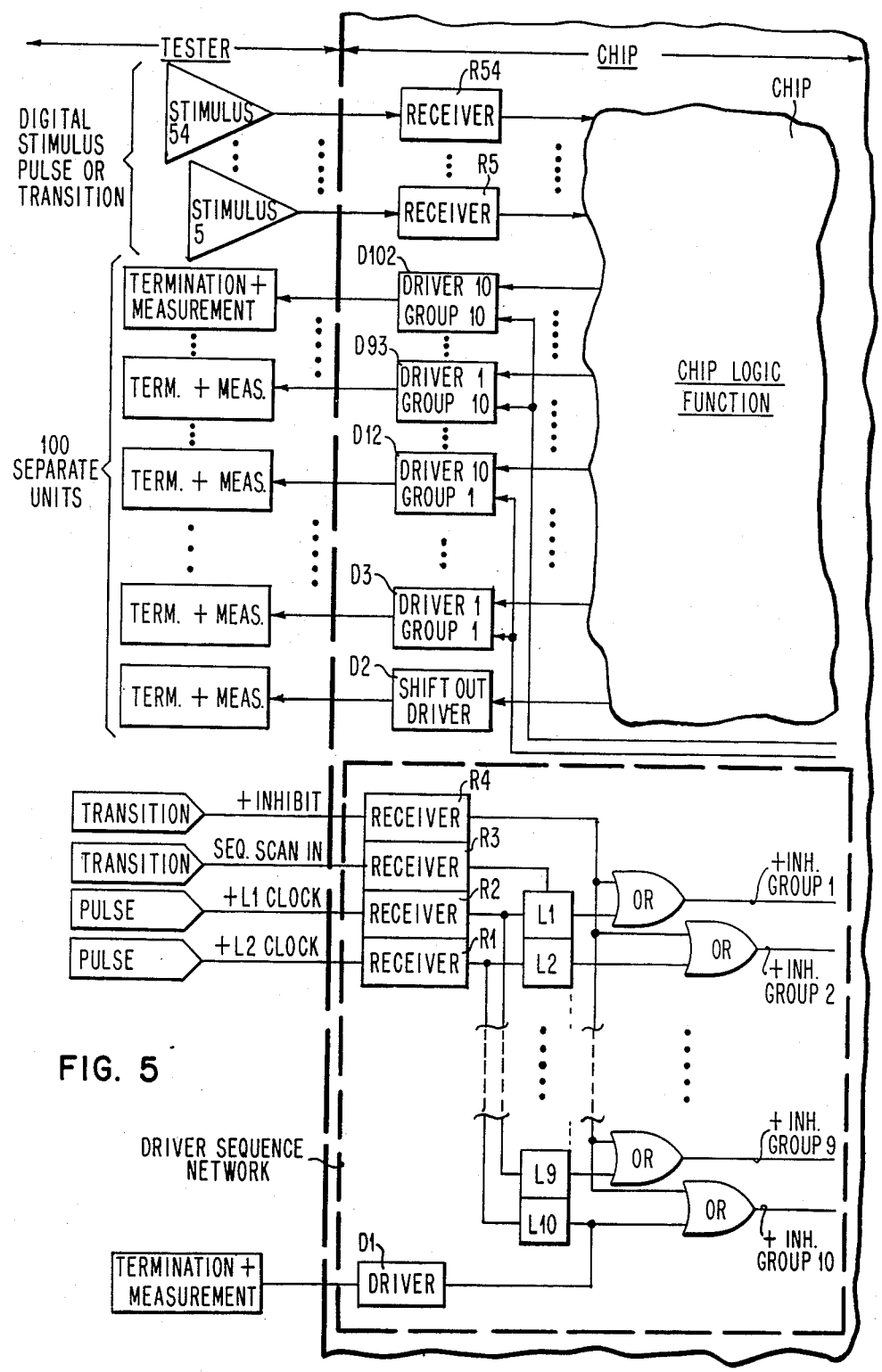
Figure 6:
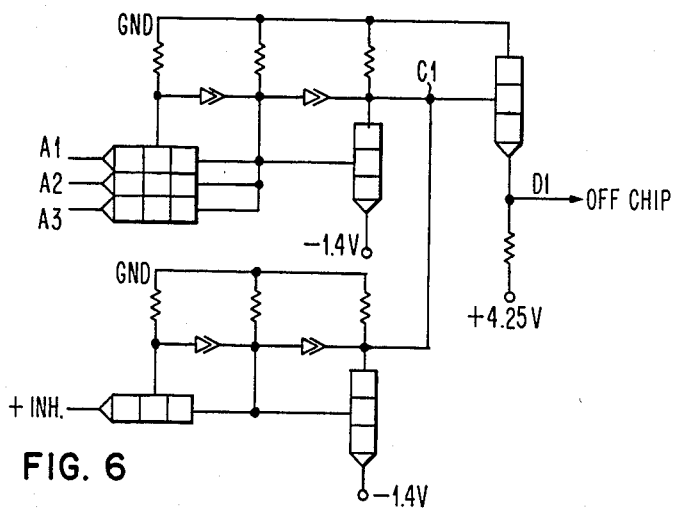

FIG. 5 discloses a preferred embodiment of the invention wherein an integrated circuit chip under test includes a driver sequence network (DSN). FIG. 6 illustrates a representative driver circuit having three logic inputs, an inhibit input and an output.

Figure 7:
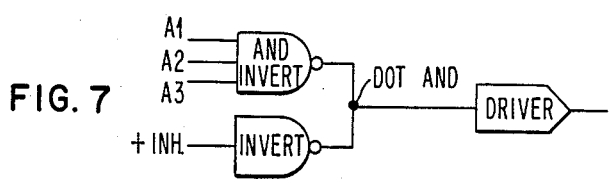

FIG. 7 discloses a block diagram of the driver circuit of FIG. 6.

Figure 8:
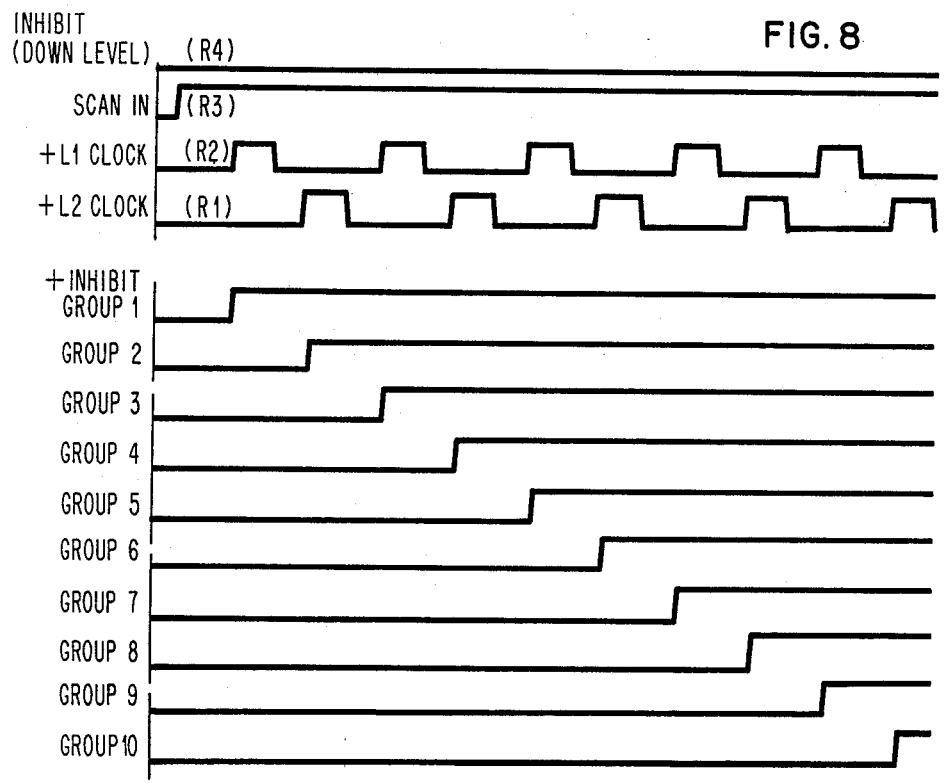

FIG. 8 discloses a timing diagram to be reviewed in conjunction with the explanation of operation of applicants invention as illustrated in FIG. 5

DESCRIPTION OF THE PREFERRED EMBODIMENT

When many off chip drivers switch simultaneously a large change in power supply current results (delta I). FIG. 1 shows this delta I and its path from the driver output wire, through the driver, through the unbypassed inductance and resistance of the power supply distribution network, through the bypass capacitor and back to the tester ground. FIG. 2C shows the voltage that is generated across the unbypassed inductance and resistance as expressed by V=LdI/dt +RdI. DI and dI/dt relate directly to the driver type and the number of drivers switching together, as does the noise.

Figure 3:
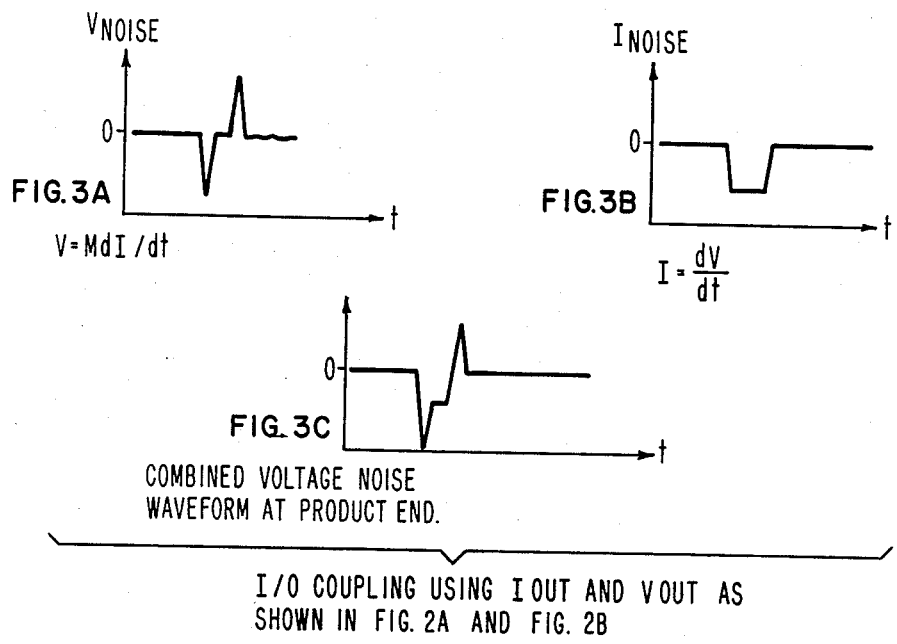
FIG. 3 is comprised of FIGS. 3A, 3B and 3C.

Voltage and current signals which change as a driver changes state can also couple into nearby I/O paths to the extent that false switching and test failures occur. FIG. 3 shows the voltage and current that can be coupled as expressed by the equations $V = MdI/dt$ and $I = CdV/dt$, where M is the mutual inductance and C is the mutual capacitance between the paths. Again the noise relates directly to the driver type (speed) and the number of drivers coupling noise into a nearby I/O path.

FIG. 4 shows an example of a driver sequencing network. Inputs labeled "+Inhibit," "Shift In," "L1 Clock," and "L2 Clock" are controlled by the tester. Outputs "+Inhibit Group 1" through "+Inhibit Group 4" continue on the chip as the inhibit control lines for the respective off chip driver groups. The driver sequencing network shown is on the chip.

The latches in FIG. 4 labeled "L1 Latch" and "L2 Latch" are chained together into the commonly known shift register configuration. Data applied at the "Shift In" input will be sequentially passed to successive latches as the L1 clock and L2 clock are alternately applied. The OR blocks shown allow either the "+Inhibit Input" or the shift register contents to control the four "+Inhibit Group" outputs. The "+Shift Out" output is available to the tester for testing of the shift register string.

In the operation then; (1) let "+Inhibit" = "logical 1 state" thereby inhibiting all off chip drivers by setting a "logical 1" on all "+Inhibit Group" lines. (2) Now the shift register can be preset to a known state (all latch outputs ="logical 1)" without worrying about off chip driver switching. (3) Next, change "+Inhibit" = "logical 0". The off chip drivers are still inhibited by the latch contents. (4) Finally let "Shift In" = "logical 0" and sequentially shift the "logical 0" (by alternating L1 and L2 Clocks) until all latch outputs are a "logical 0". In doing this we have sequentially enabled the groups of drivers with a separation between the groups equal to the separation between the L1 clock and the L2 clock. (5) To sequentially disable the off chip drivers, set Shift In = "logical 1" and then sequentially shift the "logical 1" onto all four latch outputs. In system operation both "+Inhibit" and "Shift In" must be a logical 0. The L1 Clock and L2 Clock must both be kept at their active logic level so that the Shift In data ("logical 0") will be kept on the latch outputs. The off chip drivers will always be enabled in this case.

It should be noted that adding latches to the shift string, and corresponding 'OR' gates, allows control over a greater number of off chip driver groups. For example:

Assume 240 off chip drivers on the chip
Assume 12 groups are formed (by design) Therefore 20 drivers per group are allowed and 6 L1 latches 6 L2 latches and 12 OR gates are required to control the 12 groups.

No additional connections are required to the tester.

A latent ability exists which would allow selective enabling of off chip drivers by presetting the shift register while the drivers are inhibited, then changing +Inhibit to "0" to allow the preset shift register to enable the driver groups selected.

The advantages and disadvantages of the driver sequencing network (DSN) are:

(1) Flexible—The DSN can be employed or ignored as desired. Problem part numbers may require the DSN to be used whenever a test pattern called for the drivers to be enabled. The drivers will be sequence enabled, measured, and then sequence inhibited for each such pattern.

(2) Driver Groups—Each group may be designed to minimize both coupled and power supply noise through physical selection of the driver placement for each group. In addition, troublesome drivers can be restricted to a specific number per group, instead of just by the group size.

(3) Easily Implemented—Requires no new test hardware and relatively small changes to test generation.

(4) Tester controlled sequencing—The tester has full control of the time separation between groups of switching drivers.

(5) Low overhead—Low circuit count in DSN and no performance penalty for the user of the device.

(6) Compatible—The DSN is compatible with electronic chip in place testing (ECIPT) (ECIPT is Electronic Chip In Place Testing and is fully disclosed in U.S. Pat. No. 4,504,784 entitled "Method of Electronically Testing A Packaging Structure Having Integrated Circuit Chips", and granted Mar. 12, 1985 to P. Goel et al.), partitioning driver inhibit pin techniques, and self test concepts.

(7) Shipped Product Quality Level (SPQL)—Since the DSN is uniquely a testing aid, it need not be tested for full fault coverage. The small circuit count and minimal interface to the device logic makes the DSN a negligible contributor to device yield loss and SPQL.

(8) The DSN is not readily useable at the next level of packaging. DSN's are mainly needed at wafer, chip and single chip module testing.

(9) The DSN may require only 3 to 5 I/O pins or contacts depending on the embodiment.

(10) Unique DSN inputs can be defined at wafer test for devices intended for multi-chip modules (MCM's). Contact pads not normally useable at the next level of assembly can be used as DSN inputs.

A preferred embodiment of the invention employing the driver sequence network can be seen in FIG. 5. The logic function internal to the chip is fed by a plurality of logical input receivers R5 through R54. The chip's logic function output is passed back to the tester through off chip drivers D2 through D102. Each driver D3 through D102 has a driver inhibit input which, when active, blocks (inhibits) the logic state coming into the driver and forces the driver output to a known or high impedance state. Driver D2 does not get inhibited in any circumstance. D2 is the commonly known shift register output of a Level Sensitive Scan Design (LSSD) register string. The LSSD register string is utilized in the chip logic function and enhances testability of that logic. FIG. 6 shows an example of a driver circuit with three logic inputs and an inhibit input.

All of the items listed above are fabricated on the chip and are normal or conventional to a VLSI chip. To embody a Driver Sequence Network, additional receivers, drivers and logic is required. A representative DSN is shown enclosed within a broken line bearing the legend "Driver Sequencing Network" at the lower right of FIG. 5. The off chip drivers D3 through D102 are divided into groups of ten drivers each. Each group shares a common inhibit line so that there are ten separate group inhibit lines, one for each driver group. Again, D2 does not get inhibited because it provides the shift register output function. The group inhibit lines may all be set to the inhibiting state simultaneously by the "+Inhibit" control line or each group inhibit line may be brought up sequentially by using the 'Sequence Scan In', '+L1 Clock', and '+L2 Clock' to shift a logical '1' through the ten shift register latches (L1 through L10). Likewise the "+Inhibit" line may allow all group inhibit lines to go to the enable state simultaneously, or each line may be enabled sequentially by shifting a logical '0' through the ten latches (See FIG. 8 for a timing diagram of the shift operation). Driver D1 facilitates testing of the sequencing shift register of the DSN by providing a shift register output to the tester.

With this embodiment the following test execution steps can be used to prevent too many off chip drivers from switching simultaneously.

1. Apply a logic '1' on the "+Inhibit" line of the tester to receiver R4 of the driver sequencing network.
2. Power up the chip from the tester (not shown) Note: Off-Chip drivers D3-D102 are inhibited
3. Apply a logic '1' on the "Sequence Scan-In" line of the tester to receiver R3 of the "Driver Sequencing Network". Concurrently impress alternate clock pulses (+L1 clock and +L2 clock) on receivers R2 and R1 of the "Driver Sequencing Network" five times to load the shift register (L1 through L10) with logic '1's.
4. Utilizing the "+Inhibit Line" apply a logic '0' to receiver R4 of the "Driver Sequencing Network" Note: Drivers D3-D102 are still inhibited by L1-L10. Steps 1 to 4 are only used for power on initialization.
5. Apply logical inputs from the tester (stimulus 5-54) to the on-chip receivers R5-R54 to test the chip logic for faults.
6. Apply a logical '0' via the "Sequence Scan-In" line to receiver R3. Concurrently utilize the +L1 and the +L2 clock to provide alternative clock pulses to R2 and R1 five times to sequentially load logic 0's into latches L1-L10. This action sequentially enables each of the ten groups of drivers.
7. Use the tester to measure the output states of drivers D3-D102 and compare them against the expected states to verify a fault free test.
8. Apply a logic '1' on the "Sequence Scan-In" of the tester to receiver R3. Concurrently utilize the +L1 clock and the +L2 clock to provide alternate clock pulses to receivers R2 and R1 five times to sequentially load logic 1's into latches L1-L10. This action sequentially inhibits each of the ten groups of drivers. (As shown in FIG. 8.)
9. Apply tester stimulus to on-chip receivers R5-R54 in order to shift out data captured in the LSSD shift register (not shown) of the logic chip.

Measure each data bit shifted out through off-chip driver D2 and compare against the expected bit string to verify a fault free test.

Repeat steps 5 to 9 until all desired tests have been made.

During sequencing of the driver groups (inhibit or enable) further noise reduction is possible by increasing the pulse separation between the +L1 clock pulse and the +L2 clock pulse.

A key assumption has been made that ten off chip drivers may switch simultaneously without disturbing a test. This 'group size' (ten drivers per group) should be determined conservatively because it can be sensitive to many parameters including driver speed and logic noise margins. Reducing the group size is not costly. For each additional group created the cost is one new latch (i.e. L11) and one new 'OR' gate. No additional I/O connections are needed.

While the invention has been particularly described with reference to the preferred embodiment, it will be understood by those skilled in the art that the foregoing and other changes and details may be made therein without departing from the spirit and scope of the invention.

What is claimed is:

1. An integrated circuit chip for performing a logical function, said integrated circuit chip including:
    a plurality of chip input terminals for receiving a binary input;
    a plurality of chip output terminals for providing a binary output;
    a plurality of off-chip driver circuits, each of said off-chip driver circuits having a first input, an inhibit input and an output, said outputs of said plurality off-chip driver circuits connected to said plurality of chip output terminals, each of said off-chip driver circuits capable of assuming a first binary state, a second binary state or a switching inhibited state;
    logical circuit means connected between said plurality of chip input terminals and said first inputs of said plurality of off-chip driver circuits, said logical circuit means receiving said binary input from said chip input terminals and providing to said first inputs of said off-chip driver circuits a binary input which is a predetermined logical function of said binary input to said plurality of chip input terminals;
    said intergrated circuit chip being characterized by the inclusion of a driver sequencing network for aiding in the testing of the integrated circuit chip, said driver sequencing network coupled to said inhibit inputs of said plurality of off-chip drivers, said driver sequencing network including shift register circuit means for receiving binary bit patterns from a tester, said binary bit patterns contained in said shift register circuit means controlling the switching inhibited state of said plurality of OFF chip drivers whereby delta I noise caused by driver switching during testing is reduced under tester control by said driver sequencing network.

2. An integrated circuit chip for performing a logical function, as recited in claim 1, wherein said plurality of off-chip drivers comprises k off-chip drivers, where k is a positive integer having a range of 10 to 1000,
    where said driver sequencing network (DSN) has n outputs, where n is a positive integer in the range of 4 to 500, each of said n outputs of said driver sequencing network connected to a discrete one of n groups of said plurality of off-chip driver circuits, each one of said n groups of Off-chip drivers including at-least two off-chip driver circuits and the total number of off-chip driver circuits contained in said n groups of off-chip driver circuits being equal to k, whereby in response to binary bit patterns from the tester to said driver sequencing network, said groups of off-chip are sequentially conditioned to switch during testing.

3. An integrated circuit chip for performing a logical function, as recited in claim 6, wherein said driver sequencing network includes:

an Inhibit Input for receiving an inhibit signal; a sequence scan input for receiving a sequence scan signal;

a first (+L1) clock input for receiving a first clock signal;

a second (+L2) clock input for receiving a second clock signal;

a multi-stage shift register having n stages, each stage having an output and a clock input, said first stage of said multi-stage shift register having an input serving as the input of said multi-stage shift register, said output of said last stage of said multi-stage shift register serving as the output of said multi-stage shift register;

n OR circuits, each of said n OR circuits having a first input, a second input and an output;

first connection means connecting in common said Inhibits input of said driver sequencing network and said first input of each of said n OR circuits;

second connection means connecting said second inputs of said n OR circuits respectively to said n output of said n stage shift register;

third connection means connecting said Sequence Scan Input to said input of said multi-stage shift register;

fourth connection means connecting said first clock input to said clock inputs of alternate stages of said n stages of said multi-stage shift register;

fifth connection means connecting said second clock input to the remaining alternate stages of said n stages of said multi-stage shift register; and sixth connection means connecting said n outputs of said n OR circuits each to the inhibit input of the off-chip drivers of a discrete one of said n groups of off chip driver circuit.

4. A method of testing an integrated circuit chip, said method utilizing a tester and an integrated circuit chip, including:

a plurality of chip input terminals for receiving a binary input;

a plurality of chip output terminals for providing a binary output;

a plurality of off-chip driver circuits, each of said off-chip driver circuit having a first input, an inhibit input and an output, said outputs of said plurality off-chip driver circuit connected to said plurality of chip output terminals, each of said off-chip driver circuits capable of assuming a first binary state, a second binary state or a switching inhibits state;

logical circuit means connected between said plurality of chip input terminals and said first inputs of said plurality of off-chip driver circuits, said logical circuit means receiving said binary input from said chip input terminals and providing to said first inputs of said off-chip driver circuits a binary input which is a predetermined logical function of said binary input to said plurality of chip input terminals;

said integrated circuit chip being characterized by; the inclusion of a driver sequencing network for aiding in the testing of the integrated circuit chip, said driver sequencing network coupled to said inhibit inputs of said plurality of off-chip drivers, said driver sequencing network including shift register circuit means for receiving binary bit patterns from a tester, said binary bit patterns contained in said shift register circuit means controlled the switching inhibited state of said plurality of off-chip drivers whereby delta I noise caused by driver switching during testing is reduced under tester control by said driver sequencing network, wherein said plurality of off-chip drivers comprises k off-chip drivers, where k is a positive integer having a range of 10 to 1000;

said driver sequencing network (DSN) has n outputs, where n is a positive integer in the range of 4 to 500, each of said n outputs of said driver sequencing network connected to a discrete one of n groups of said plurality of off-chip driver circuits, each one of said n groups of off-chip drivers including at-least two off-chip driver circuits and the total number of off-chip driver circuits contained in said n groups of off-chip driver circuits being equal to k, whereby in response to binary bit patterns from the tester to said driver sequencing network, said groups of off-chip drivers are sequentially conditioned to switch during testing;

said method including the following steps in the order recited;

(a) utilizing the tester, impress a binary test pattern on the plurality of input terminals of said integrated circuit chip under test;

(b) utilizing the tester, convey binary bit pattern to the driver sequencing network of the integrated circuit chip under test to sequentially condition for possible stitching each of said n groups of off-chip drivers; and (c) compare a binary output appearing at said plurality of output terminals of said integrated circuit chip under test to a known binary pattern to determine the merit, or lack of merit, of the integrated circuit chip under test, whereby spurious test results from delta I noise is eliminated.

5. A logic chip for receiving a binary input and providing a binary output, said binary output being a predetermined logical function of said binary input, said logic chip comprising:

a plurality of input terminals for receiving said binary input;

a plurality of output terminals for providing said binary output;

a plurality of off-chip driver circuits, each of said off-chip driver circuits having at least one input, an inhibit input and an output connected to one of said plurality of output terminals, logical circuit means coupled between said plurality of input terminals and said at least one inputs of said plurality of off-chip drivers;

said logic chip being characterized by the inclusion of a driver sequencing network for enhancing the integrity of the test results provided to a tester during the testing of said logic chip, said driver sequencing network including, input circuit means for receiving at least one control input and a data pattern from a tester, and shift register circuit means connected to said input circuit means and selectively connected to each of said inhibit inputs of each of said off-chip driver circuits, whereby under tester control during testing of said chip simultaneous switching of more than a predetermined number of off-chip drivers is precluded by said control input and said data pattern provided by said tester to said shift register circuit means of said driver sequencing network and delta I noise is controlled.

6. An integrated circuit logic chip, said logic chip comprising:
- a plurality of receiver circuits, each of said receiver circuits having an input and an output;
- n groups of off-chip driver circuits, each of said n groups of off-chip driver circuits having two or more off-chip driver circuits, each off-chip driver circuit having a data input, an inhibit input and an output, where in the absence of an inhibit signal impressed on said inhibit input said off-chip driver circuit output will manifest a first binary state or a second binary state in response to a binary input impressed on said data input, and where in the presence of an inhibit signal impressed on said inhibit input, said off-chip driver circuit output will manifest a switching inhibited state;
- logical circuit means, said logical circuit means coupled to said outputs of said plurality of receiver circuits and to said data inputs of said n groups of off-chip driver circuits, said logical circuit means receiving a binary input from said receiver circuits and providing a binary output which is a logical function thereof, said binary output from said logical circuit means being impressed on said data inputs of said n groups of off-chip driver circuits; and,
- said integrated circuit logic chip being characterized by the inclusion of a driver sequencing network, said driver sequencing network comprising,
  - a first receiver circuit having an input terminal and an output terminal, said input terminal of said first receiver circuit receiving an inhibit signal,
  - a second receiver circuit having an input terminal and an output terminal, said input terminal of said second receiver circuit receiving a sequence scan in signal,
  - a third receiver circuit having an input terminal and an output terminal, said input terminal of said third receiver circuit receiving a first clock signal,
  - a fourth receiver circuit having an input terminal and an output terminal, said input terminal of said fourth receiver circuit receiving a second clock signal,
  - an n stage shift register, said n stage shift register having an input terminal, n clock terminals and n output terminals, said input terminal of said n stage shift register connected to said first stage of said n stage shift register and to said output terminal of said second receiver circuit, said n clock terminals respectively connected to said n stages of said n stage shift register and to said output terminals of said third and fourth receiver circuits, said n outputs of said n stage shift register respectively connected to said n stages of said n stage shift register, and
  - n OR circuits, each of said n OR circuits having a first input, a second input and an output, said first input of each of said n OR circuits connected in common to said output terminal of said first receiver circuit, said second inputs of said n OR circuits respectively connected to said n output terminals of said n stage shift register and said n outputs of said n OR circuits respectively connected to said inhibit inputs of said n groups of off-chip driver circuits.

7. A method of testing a logic chip, said method utilizing a tester and a logic chip, said logic chip comprising:
- a plurality of receiver circuits, each of said receiver circuits having an input and an output;
- n groups of off-chip driver circuits, each of said n groups of off-chip driver circuits having two or more off-chip driver circuits, each off-chip driver circuit having a data input, an inhibit input and an output, where in the absence of an inhibit signal impressed on said inhibit input, said off-chip driver circuit output will manifest a first binary state or a second binary state in response to a binary input impressed on said data input, and where in the presence of an inhibit signal impressed on said inhibit input, said off-chip driver output will manifest a switching inhibited state;
- a plurality of ehip output terminals, said plurality of chip output terminals connected to said output of said off-chip driver circuits;
- logical circuit means, said logical circuit means coupled to said outputs of said plurality of receiver circuits and to said data inputs of said n groups of off-chip driver circuits, said logical circuit means receiving a binary input from said receiver circuits and providing a binary output which is a logical function thereof, said binary output from said logical circuit means being impressed on said data inputs of said n groups of off-chip driver circuits; and,
- said integrated circuit logic chip being characterized by the inclusion of a driver sequencing network, said driver sequencing network comprising,
  - a first receiver circuit having an input terminal and an output terminal, said input terminal of said first receiver circuit receiving an inhibit signal,
  - a second receiver circuit having an input terminal and an output terminal, said input terminal of said second receiver circuit receiving a sequence scan in signal,
  - a third receiver circuit having an input terminal and an output terminal, said input terminal of said third receiver circuit receiving a first clock signal,
  - a fourth receiver circuit having an input terminal and an output terminal, said input terminal of said fourth receiver circuit receiving a second clock signal,
  - an n stage shift register, said n stage shift register having an input terminal, n clock terminals and n output terminals, said input terminal of said n stage shift register connected to said first stage of said n stage shift register and to said output terminal of said second receiver circuit, said n clock terminals respectively connected to said n stages of said n stage shift register and to said output terminals of said third and fourth receiver circuits, said n outputs of said n stage shift register respectively connected to said n stages of said n stage shift register,
  - n OR circuits, each of said n OR circuits having a first input, a second input and output, said first input of each n OR circuits connected in common to said output terminal of said first receiver circuit, said second inputs of said n OR circuits respectively connected to said n output terminals of said n stage shift register and said n outputs of said n OR circuits respectively connected to said inhibit inputs of said n groups of off-chip driver circuits, said method including the following steps in the order recited;
(a) impress a binary test pattern on the plurality of input terminals of said logic chip under test;
(b) convey binary bit patterns to the driver sequencing network of the logic chip under test to sequentially condition for possible switching the off-chip drivers of each of said n groups of off-chip drivers; and
(c) compare a binary output appearing at said plurality of output terminals of said logic chip to a expected binary output to determine the merit, or lack of merit, of the chip under test, whereby spurious test results from delta I noise is eliminated.

* * * * *